(12) United States Patent
Lewis

(10) Patent No.: US 7,283,942 B1
(45) Date of Patent: Oct. 16, 2007

(54) HIGH SPEED TECHNIQUES FOR SIMULATING CIRCUITS

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 748 days.

(21) Appl. No.: 10/305,797

(22) Filed: Nov. 26, 2002

(51) Int. Cl.
*G06F 17/50* (2006.01)
*G06F 9/45* (2006.01)

(52) U.S. Cl. .................. 703/14; 716/1; 716/2; 716/3; 716/4; 716/5; 716/6; 716/7; 716/8; 716/9; 716/10; 703/16; 703/19; 703/22

(58) Field of Classification Search .............. 703/14; 716/14
See application file for complete search history.

(56) References Cited

U.S. PATENT DOCUMENTS

| 5,392,227 | A * | 2/1995 | Hiserote ............... 703/14 |
| 6,308,304 | B1 * | 10/2001 | Devgan et al. ......... 716/5 |
| 6,499,129 | B1 * | 12/2002 | Srinivasan et al. ...... 716/4 |
| 6,751,579 | B1 * | 6/2004 | Misheloff et al. ....... 703/2 |
| 6,973,420 | B1 * | 12/2005 | Tetzlaff ............... 703/14 |

OTHER PUBLICATIONS

Lewis, D.M., "Device Model Approximation Using 2N Trees" 1990, IEEE pp. 30-38.*
Lewis, D.M., "A Hierarchical Compiled Code Event-Driven Logic Simulator" 1990, IEEE pp. 726-737.*
Lewis, D.M., "Hierarchical Compiled Event-Driven Logic Simulation" 1989, IEEE pp. 498-501.*
Yao et al., "A Consistent Nonlinear Simulation Environment Based on Improvement Harmonic Balance Techniques" 1993, IEEE, p. 90-95.*
Nebel et al., titled, "Symbolic Pole/Zero Calculation Using SANTAFE" IEEE 1995 p. 752-761.*
Devgan, A. and Rohrer, R.A. (1994). "Adaptively Controlled Explicit Simulation," IEEE Transactions on Computer-Aided Design of Integrated Circuits and Systems 13(6):746-762.
Elmore, W.C. (1948). "The Transient Response of damped Linear Networks with Particular Regard to Wideband Amplifiers," Journal of Applied Physics, 19(1):55-63.
Lin, S. et al. (1993). "Stepwise Equivalent Conductance Circuit Simulation Technique," IEEE Transactions on Compuer-Aided Design of Integrated Circuits and Systems 12(5):672-683.

(Continued)

*Primary Examiner*—Anthony Knight
*Assistant Examiner*—Tom Stevens
(74) *Attorney, Agent, or Firm*—Townsend and Townsend and Crew LLP

(57) ABSTRACT

The present invention provides techniques for high speed electrical simulation of circuits. According to one embodiment of the present invention, a delay path can be divided into sub-paths called simulation paths. Each simulation path is simulated separately to determine its contribution to the overall delay in the path. According to another embodiment of the present invention, linear and non-linear loads are modeled using linear circuit models to further increase the speed of the simulator. According to another embodiment, driver circuits are simulated using non-linear circuit models. Before a simulation is performed, sample input and output values for the non-linear models are computed and stored in memory. When a circuit design is simulated, the input and output values are accessed from the memory. Intermediate values are determined by interpolating from the values stored memory.

24 Claims, 7 Drawing Sheets

OTHER PUBLICATIONS

Nagel, L.W., "SPICE2, a computer program to simulate semiconductor circuits, Dissertation", Univ California, Berkeley, CA, May 1975, pp. 26-48, 114-159.

Pillage, L.T. et al. (1995), "Electronic Circuit and System Simulation Methods," McGraw-Hill, Inc. New York, pp. 1-44, 285-356.

Rubenstein, J. et al. (1983). "Signal Delay in RC Tree Networks," IEEE Transactions on Computer-Aided Design, 202-211.

Sakallah, K.A. and Director, S.W. (1985). "SAMSON2:An Event Driven VLSI Circuit Simulator," IEEE Transactions on Computer-Aided Design CAD-4(4):668-682.

Visweswariah, C. and Rohrer, R.A. (1991). "Piecewise Approximate Circuit Simulation," IEEE Transactions on Computer-Aided Design 10(7) Jul. 1991.

* cited by examiner

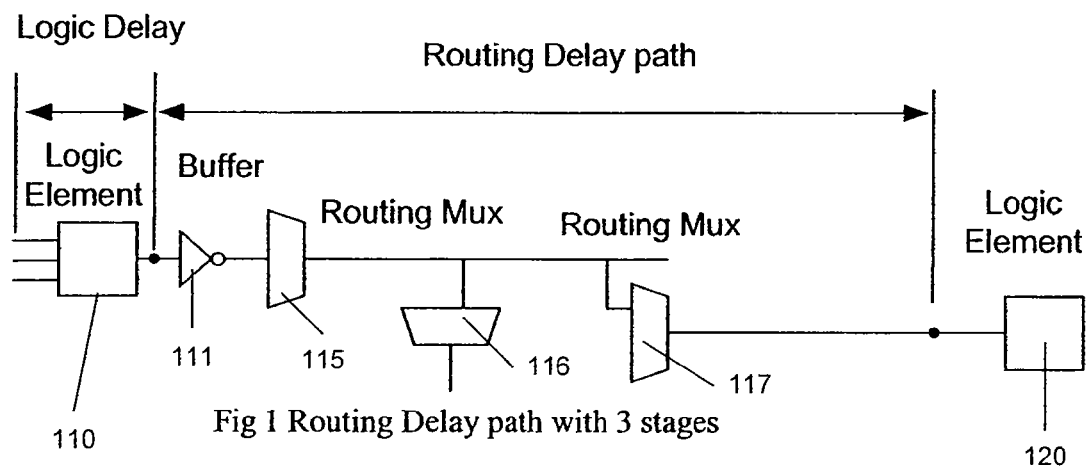
Fig 1 Routing Delay path with 3 stages
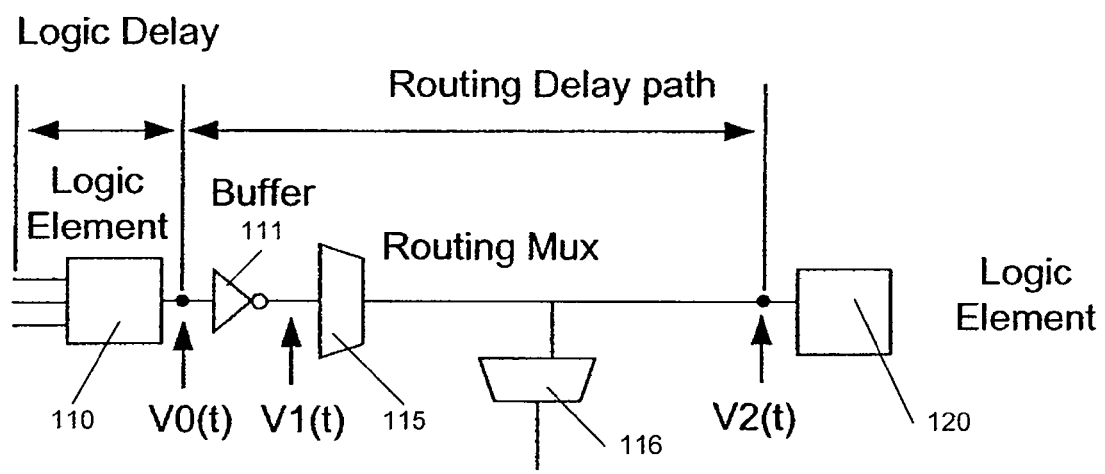
Fig 2 Routing Delay Path with 2 Stages and Measurement Points

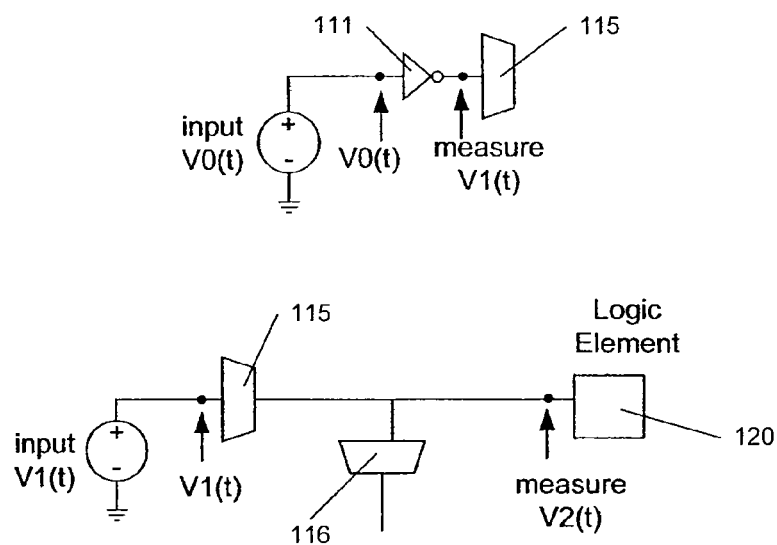
Fig 3 Breaking Routing Path into 2 Simulation Paths and Simulating Each Independently
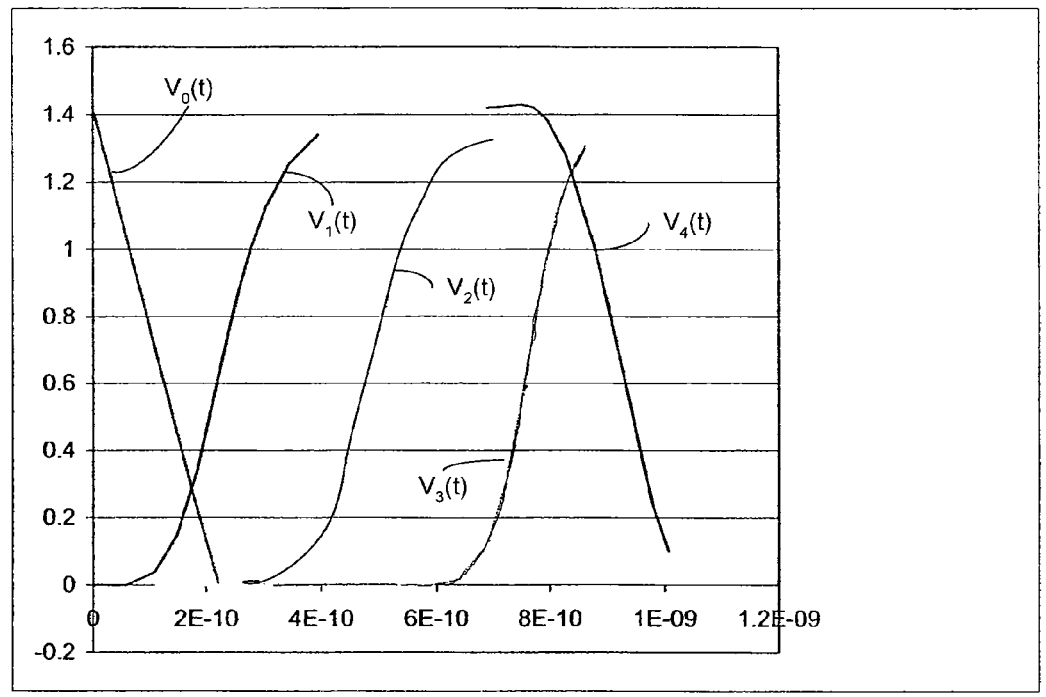
Fig 4: Example Waveforms from Routing Delay Path Comprising 4 Simulation Paths

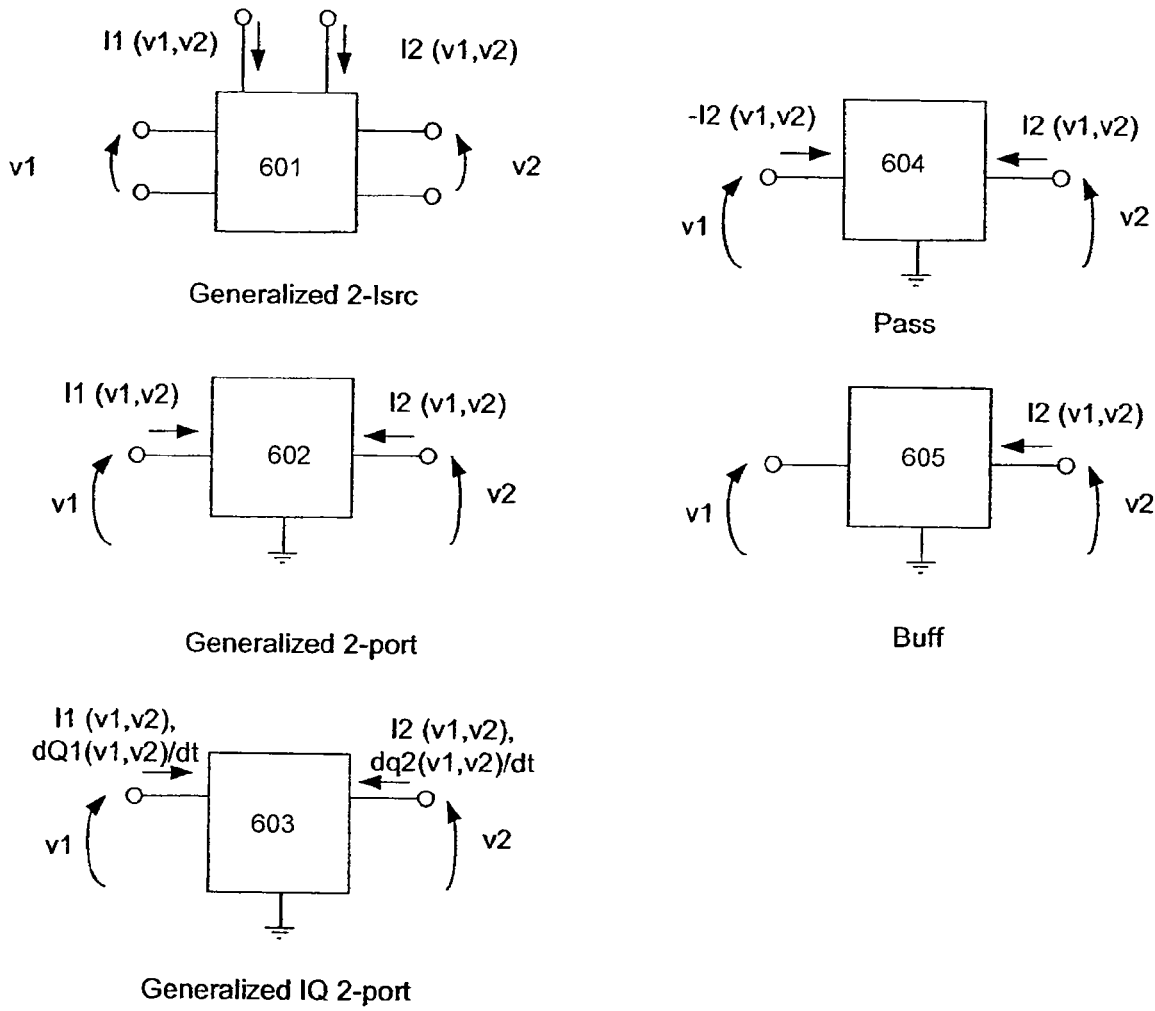
Fig 6: Set of Electrical Building Blocks with 2 Controlling Voltages

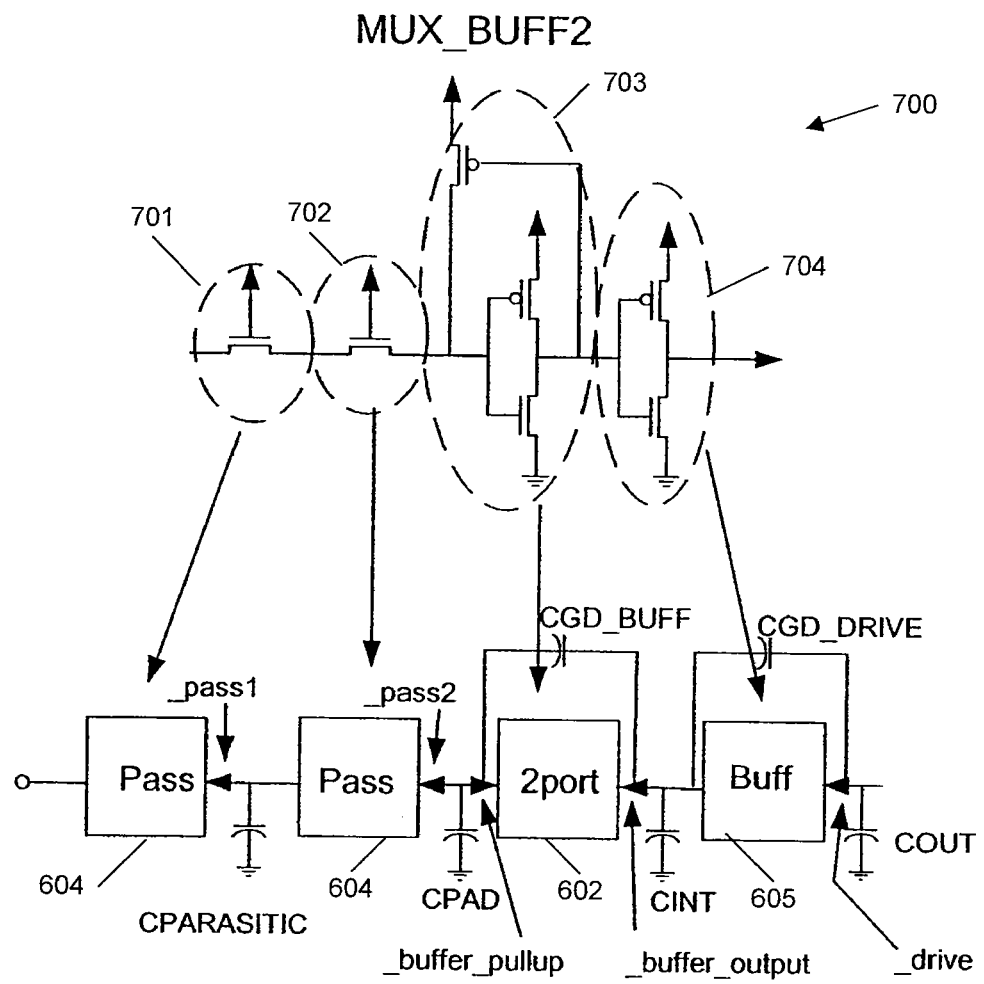
Fig 7: Circuit of Mux and Equivalent Implementation Using Building Blocks

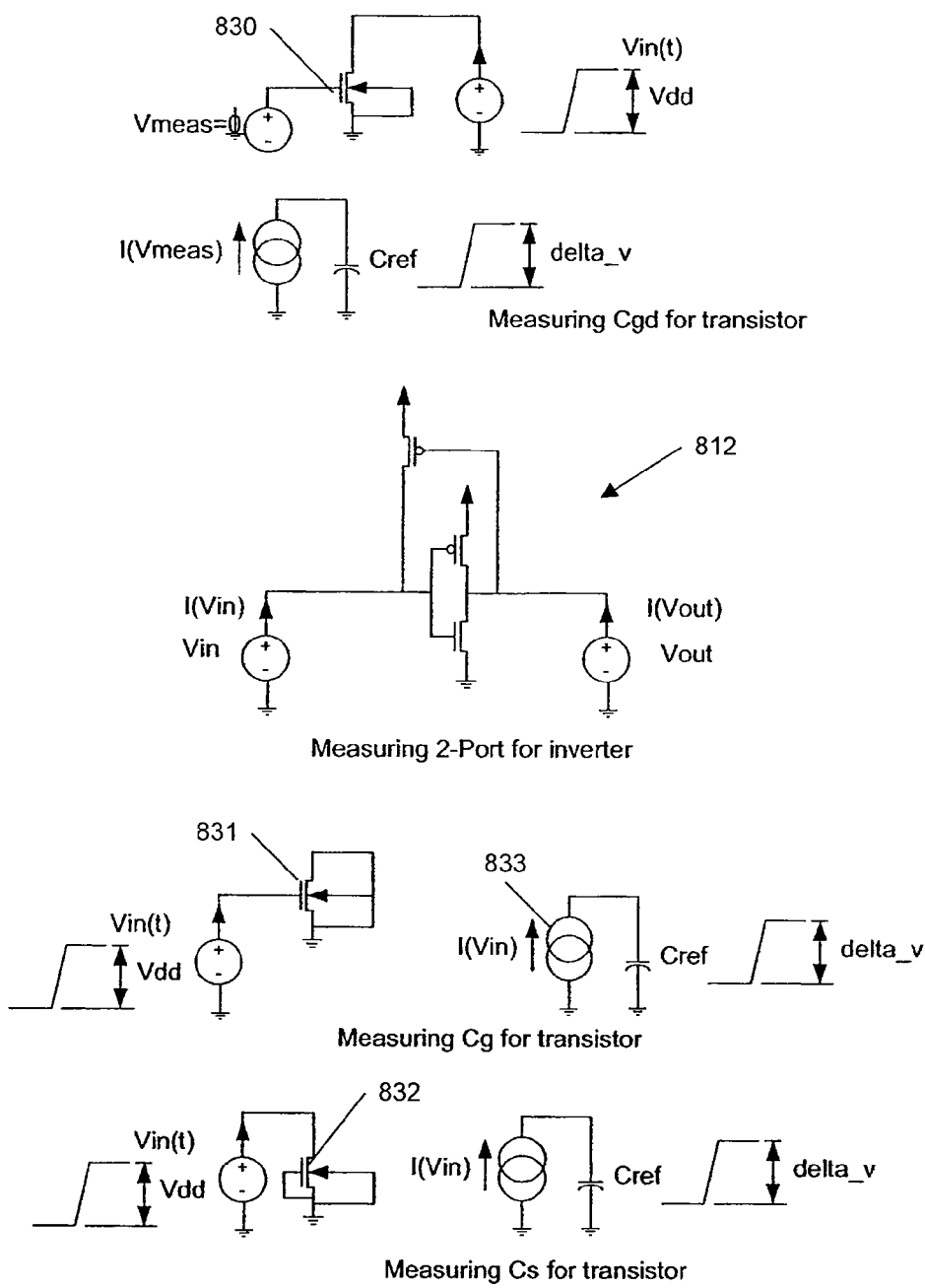
Figure 8: Example Measurement Circuits for Buffer Currents and Transistor Gate Capacitance

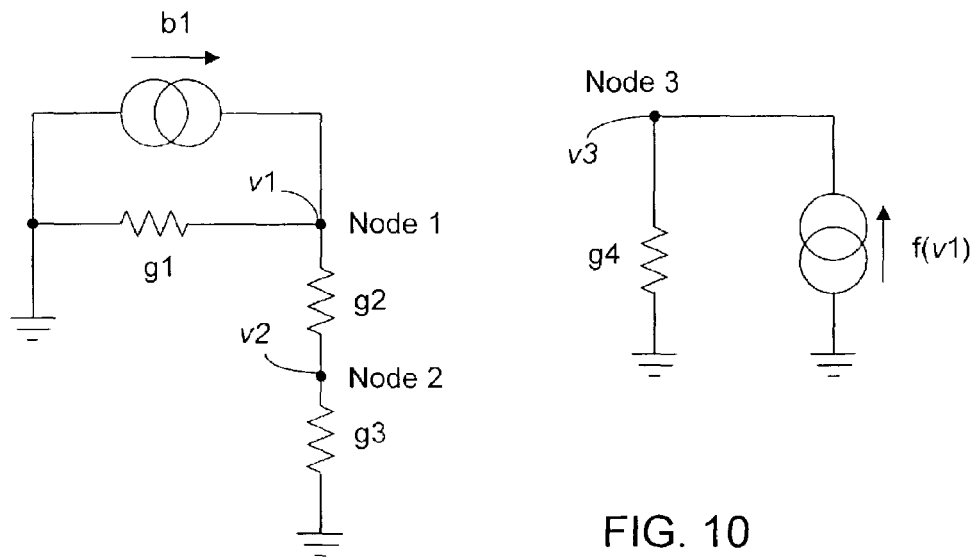
FIG. 9
FIG. 10
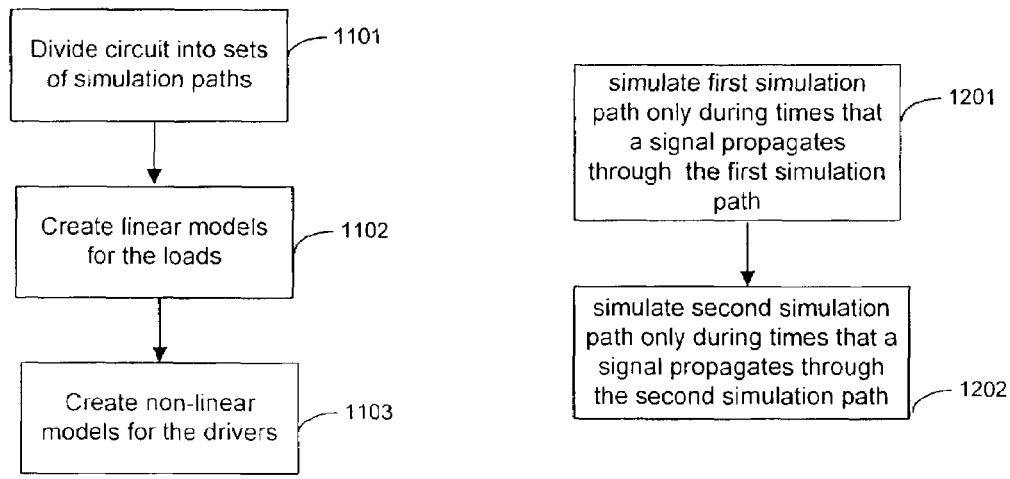
FIG. 11
FIG. 12

HIGH SPEED TECHNIQUES FOR SIMULATING CIRCUITS

BACKGROUND OF THE INVENTION

This invention relates to techniques for simulating circuits, and more particularly, to techniques for simulating circuits at high speeds.

Electronic circuits can be simulated using computer aided design (CAD) software such as HSPICE. A user can build a software model of a circuit design in HSPICE. HSPICE can test the software model by applying input signals and plotting the output signals of the model.

However, CAD simulation tools such as HSPICE can be very slow, especially when modeling circuit designs that contain several non-linear circuit elements. Complex equations are typically needed to accurately describe the behavior of non-linear circuit elements. HSPICE uses iterative approaches to solve these complex equations. Using iterative approaches to solve complex equations can be time consuming.

Therefore, it would be desirable to provide techniques for simulating circuit designs at higher speeds.

BRIEF SUMMARY OF THE INVENTION

The present invention provides techniques for high speed electrical simulation of circuits. The techniques of the present invention can be used to simulate any circuit design such as a programmable logic device (PLD), a field programmable gate array (FPGA), or a programmable logic array.

According to one embodiment of the present invention, the path from a source circuit element to a destination circuit element can be broken into sub-paths called simulation paths to speed the simulation by exploiting spatial-temporal locality. Each simulation path can contain a single driver, routing wires, and loads. Each simulation path is simulated separately to determine its contribution to the overall delay in the path. This approach substantially increases the speed of the simulation process.

According to another embodiment of the present invention, linear and non-linear loads are modeled using linear circuit models to further increase the speed of the simulator. The linear models represent the linear aspects of the non-linear loads. The linear models can ignore the non-linear characteristics of the non-linear loads. Alternatively, the linear models can approximate the non-linear characteristics of the non-linear loads. According to one embodiment of the present invention, the values of the linear models are optimized to minimize the simulation error that is caused by approximating the non-linear characteristics using a linear model.

According to another embodiment of the present invention, driver circuits are simulated using non-linear circuit models. Logic gates and multiplexers are examples of driver circuits. The present invention further increases simulation speed by automatically separating the linear and non-linear circuit models. Before a simulation is performed, a table of electrical properties for the non-linear circuit models is computed and stored in a database. The database is loaded into memory in advance of the circuit simulation. When a circuit design is simulated, the values representing the electrical properties of the non-linear devices are accessed from the database. Intermediate values are determined by interpolating from the values stored in the database.

Accessing data from memory and interpolating from the stored data requires substantially less time than calculating accurate values for non-linear circuits using an algorithmic computation, such as an analytical device model, each time a simulation is performed. The present invention provides faster techniques for simulating circuits designs that include non-linear subcircuits. The simulation techniques of the present invention provide relatively accurate simulation values using approximations for non-linear subcircuits.

Techniques of the present invention also reduce the complexity of circuit models by taking advantage of device terminals that are connected to fixed voltages.

BRIEF DESCRIPTION OF THE DRAWINGS

FIG. 1 illustrates an example of a delay path can that be extracted according to the principles of the present invention;

FIG. 2 illustrates a simplified delay path according to the principles of the present invention;

FIG. 3 illustrates the two simulation paths for the delay path of FIG. 2;

FIG. 4 illustrates example waveforms from a routing delay path that includes four simulation paths according to the principles of the present invention;

FIG. 6 illustrates a set of electrical building blocks according to the principles of the present invention;

FIG. 7 illustrates how a multiplexer can be represented using building blocks from FIG. 6 according to the principles of the present invention;

FIG. 8 illustrates examples of measurement circuits for buffer currents and transistor gate capacitances according to the principles of the present invention;

FIG. 9 illustrates mathematical techniques that can be used by a high speed simulation system to solve for non-linear voltages according to the principles of the present invention;

FIG. 10 illustrates an example of a circuit that can be simulated according to the principles of the present invention to determine accurate voltage values at selected nodes; and FIGS. 11 and 12 are flow charts that illustrate processes according to embodiments of the present invention.

DETAILED DESCRIPTION OF THE INVENTION

Figure 5A:
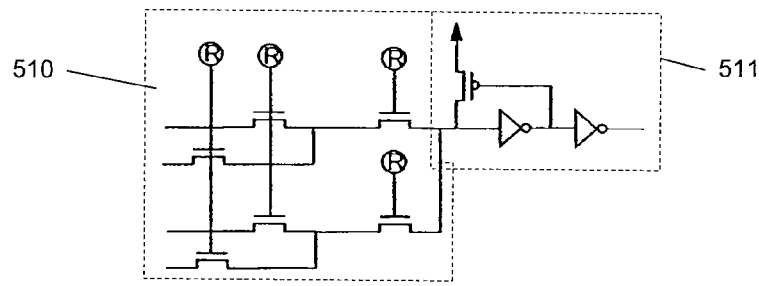
FIG. 5A illustrates a two stage NMOS multiplexer tree and a two stage driver according to the principles of the present invention.

Performance verification of VLSI (very large scale integration) circuit designs requires a timing analysis of the circuit design using post place and route electrical properties of the circuit. To accomplish performance verification of a circuit design, two techniques (delay extraction and timing analysis) are performed. Delay extraction techniques are used to determine the delay of the individual signal paths of the circuit from each circuit element to each of its fan-outs. Timing analysis techniques are used to determine the overall performance of the worst case set of paths through any sequence of circuit elements.

Delay extraction techniques are used determine the delay of each circuit element and all associated wiring relative to that circuit element's fan-outs. In a general VLSI circuit design, the circuit elements are typically logic gates, wiring, and buffers that connect the logic gates to their fan-out elements. In a programmable logic device (PLD), the circuit elements are configurable logic elements and the programmable routing switches that connect the logic element to their fan-out.

A delay path is any circuit path from a source circuit element to a destination circuit element. A delay path can be broken into sub-paths called simulation paths. Each simulation path contains a driver to speed the simulation by exploiting spatial-temporal locality. According to the present invention, each simulation path is simulated separately to determine its contribution to the overall delay in the path. This approach substantially increases the speeds of the simulation process.

FIG. 1 illustrates an example of a three-stage routing delay path that can be extracted according to the principles of the present invention. The delay path in FIG. 1 includes a logic element 110, a buffer 111 that drives the routing resources, and a series of programmable routing multiplexers 115, 116, and 117 that connect logic element 110 to its fan-outs (e.g., logic element 120).

In the example of FIG. 1, a delay path extracts the delay for only one fan-out of a circuit element at a time. According to other embodiments of the present invention, a delay path can extract the delay for multiple fan-outs of a circuit element.

The delay path in FIG. 1 includes a logic delay and a routing delay. The logic delay may be modeled as a pure delay. Pure logic delay includes a delay value dependent on the particular input to a logic element being considered, the mode of the logic element, and other factors such as the rise time of the input signal to the logic element. Alternatively, the logic element may be simulated using other techniques described herein.

The routing elements are simulated using pre-calculations according to embodiments of the present invention. In this embodiment, the input to the simulation of the routing elements is an input stimulus and the electrical circuit that describes the delay path. The input stimulus is typically a waveform represented as a voltage as a function of time.

The output signal is the waveform at the destination circuit element. The output waveform can be used to determine the total delay along the path by measuring the time difference between the input and output waveforms transitioning past a specified voltage. The delay path shown in FIG. 1 includes logic element 110, inverter 111 driving routing multiplexers 115-117, and a wire that is followed by destination logic element 120.

According to the present invention, a delay path is broken up into separate simulation paths to speed up the simulation process. Each simulation path includes a single driving element, all of the wire that is driven by that driving element, and the loads that are driven by that driving element. For example, the routing delay path shown in FIG. 1 can be broken up into three simulation paths.

The first simulation path includes buffer 111, the wire used to connect to multiplexer 115, and the loading caused by multiplexer 115. The second simulation path includes multiplexer 115, the wire used to connect to multiplexer 117, and the loading caused by multiplexer 117. The third simulation path includes multiplexer 117, the wire used to connect to logic element 120, and the loading caused by logic element 120.

FIG. 2 illustrates a simplified delay path with two stages and measurement points. The input signal to the routing delay path in FIG. 2 is $V_0(t)$. The input signal $V_0(t)$ can be specified based on the properties of logic element 110, or the simulated output of logic element 110.

According to the present invention, a delay path such as the routing delay shown in FIG. 2 can be broken up into two simulation paths. Each simulation path corresponds to one of the drivers in the routing delay path. Drivers include, for example, logic gates, inverters, multiplexers, transistors, amplifiers, and buffers.

The simulation paths for the routing delay path of FIG. 2 are shown in FIG. 3. The first simulation path begins at the output of logic element 110 and includes inverter 111 and all interconnected wiring. The first simulation path ends at the input to routing multiplexer 115, but includes the effect of multiplexer 115 loading the wire.

The second simulation path begins at the input of routing multiplexer 115. The second simulation path includes multiplexer 115 and all the wire and loads associated with multiplexer 115. The second simulation path ends at the input to the next logic element 120.

According to an embodiment of the present invention, the first and the second simulation paths are simulated separately. Each simulation path is only simulated when that simulation path is active.

The first simulation path is simulated by applying a stimulus at the input $V_0(t)$. An output signal waveform $V_1(t)$ is recorded at the destination. A simulation is run on the first simulation path until the voltage $V_1(t)$ at the destination meets some criteria. An example of such a criteria is a tolerance within the final voltage that the node will attain. For example, the simulation can end when voltage $V_1(t)$ is within 10% of the power supply voltage or ground.

The final voltage of $V_1(t)$ is recorded and then applied to the input of the second simulation path. As shown at the bottom of FIG. 3, $V_1(t)$ is the input voltage to the second simulation path. The second simulation path is simulated until the destination voltage $V_2(t)$ reaches some specified voltage.

The last point for the simulation of the second simulation path may extend past the last time point recorded for the first simulation path. As a result, there is no recorded voltage for the first path. In this case, the last recorded waveform for the first simulation path can be determined using a suitable extrapolation method (such as a linear method). The result is then clipped to the power supply voltages.

According to an embodiment of the present invention, each simulation path is only simulated when that simulation path is active. A simulation path may be active when a signal is propagating through the simulation path. As an example, a simulation path of a digital circuit may be active when its input and output voltages are switching from low to high or from high to low.

Using these techniques exploits the spatial temporal latency in the circuit and is one of the factors that reduces simulation time. The graph shown in FIG. 4 illustrates example waveforms from simulating a routing delay path that comprises four separate simulation paths. FIG. 4 illustrates how each simulation path in the delay path is simulated only for the period of time in which the simulation path is active, according to an embodiment of the present invention.

A simulation is typically performed for both a rising and falling transition of a signal, and the worst case delay of the two taken as the delay of the delay path. It is also possible to record the simulated delays for both rising and falling transitions independently, if the associated timing analyzer is capable of using this information.

For example, FIG. 4 illustrates waveforms for signals $V_0(t)$, $V_1(t)$, $V_2(t)$, $V_3(t)$, and $V_4(t)$. As the input signal $V_0(t)$ of the first simulation path transitions from high to low, the output signal $V_1(t)$ of the first simulation path transitions from low to high. In the second simulation path, the output signal $V_2(t)$ of the second simulation path transitions from low to high after the input signal $V_1(t)$ of the second simulation path transitions from low to high.

$V_2(t)$ is the input signal for the third simulation path, and $V_3(t)$ is the output signal for the third simulation path. $V_3(t)$ is the input signal for the fourth simulation path, and $V_4(t)$ is the output signal for the fourth simulation path. The voltages in each simulation path are only simulated for the period of time in which that simulation path is active.

The present invention includes techniques for simulating each simulation path. A simulation path, as described above, includes a driving element and one or more loads. In a programmable logic device (PLD), the driving element and the loads typically include routing structures such as buffers or multiplexers.

FIG. 5A illustrates an example of a circuit that includes a driver. The circuit of FIG. 5A has a two stage NMOS 4:1 multiplexer tree 510 and a two stage driver 511. Multiplexer 510 uses two way sharing. The two stage multiplexer 510 may be in one of three modes. The three modes are determined by the configuration of the multiplexer and the driver.

Loads in a simulation path can include the inputs to other driver circuits (e.g., multiplexers). Loads in a simulation path can also include the outputs from other driver circuits that are disabled. In addition, loads in a simulation path can include the resistance and capacitance of a wire or other circuit elements.

For example, a multiplexer can act as a load in a simulation path. In FIG. 2, multiplexer 115 is a load for the simulation path between $V_0(t)$ and $V_1(t)$.

Figure 5B:
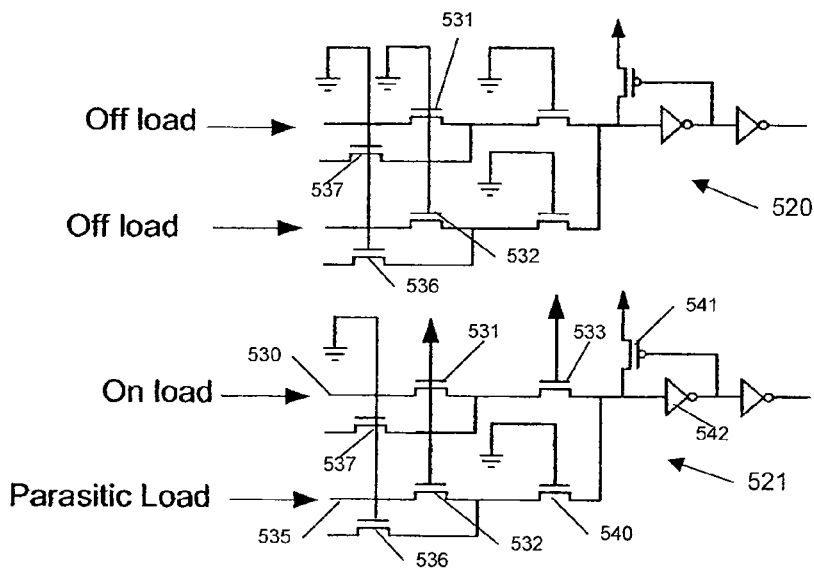
FIG. 5B illustrates examples of multiplexers in two different states according to the principles of the present invention.

The multiplexers shown FIG. 5B are examples of multiplexers that act as loads in a simulation path. A multiplexer may be completely disabled, in which case the multiplexer is off. An example is shown in FIG. 5B. Multiplexer 520 is off and decoupled from both loads at its two input terminals.

A multiplexer may also be configured to select one of the signals on a routing wire, in which case the multiplexer is on. FIG. 5B illustrates an example of multiplexer that is on. Multiplexer 521 selects the input signal at terminal 530. Multiplexer 521 is decoupled from the signal at terminal 535.

Because there are typically many transistors in a multiplexer that are controlled by a single configuration bit (such as transistors 531-533), there may be an electrical path from an input wire to an internal node of the multiplexer even when the multiplexer is not used to select the signal on that input wire. When an electrical path like this exists, a load corresponding to the internal capacitance of the multiplexer tree is exposed onto a routing wire that contains a signal not propagated by the multiplexer. Such a load is called a parasitic load. An example of a parasitic load is exposed onto the routing wire coupled to terminal 535 in FIG. 5B.

According to an embodiment of the present invention, non-linear loads can be modeled as linear loads by ignoring their non-linear aspects. For example, loads at the inputs of a routing multiplexer can be modeled as linear loads. Routing wires can also be modeled as linear circuits. The advantage of this approximation is that simulation of a linear circuits takes substantially less time, because the simulator does not have to iteratively solve complex equations that model the non-linear circuits.

To improve the simulation speed, a non-linear load (or other non-linear circuit) can be modeled as a network of resistors and capacitors. Using this technique, each load is replaced by a resistor/capacitor (RC) network that has approximately the same electrical effect on the overall circuit. In one embodiment, each load on a routing wire is replaced by an RC network. This approximation does not substantially compromise the accuracy of the simulation, because loads are less critical to the accuracy of a circuit model than driver circuits.

Figure 5C:
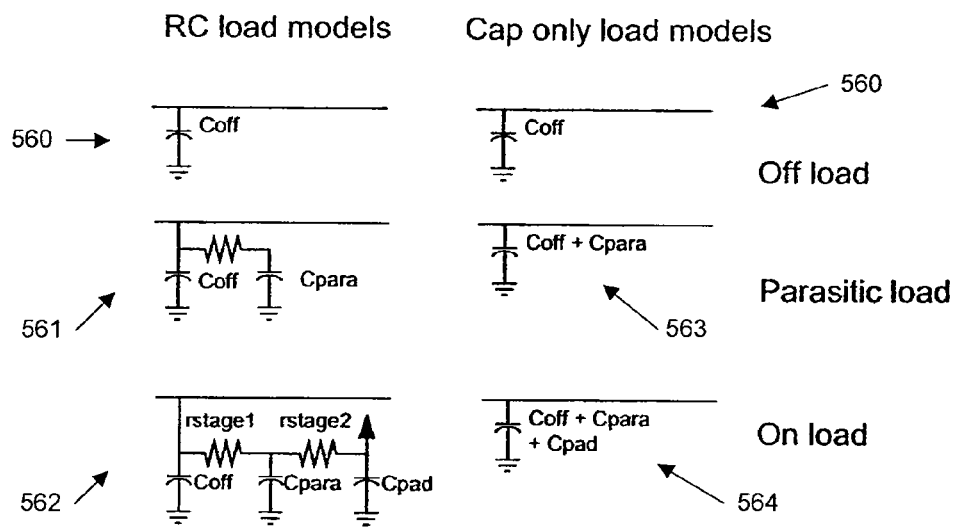
FIG. 5C illustrates examples of linear resistor and capacitor networks that can be used to model non-linear loads according to the principles of the present invention.

For example, each of a multiplexer's capacitances and non-linear conductances can be modeled as linear resistor/capacitor (RC) networks as shown in FIG. 5C. Multiplexer 520 in FIG. 5B has four input terminals. Each of the input terminals decoupled from the routing wires, because the gates of transistors 531, 532, 536, and 537 are all grounded. Each of these input terminals is referred to as an "off load." The loads of each "off load" input terminal in multiplexer 520 can be modeled as a capacitor 560 as shown in FIG. 5C. $C_{OFF}$ represents the source capacitance of the pass transistor (531, 532, 537, or 536) at a particular input terminal.

Multiplexer 521 in FIG. 5B has an input terminal 530 that is coupled to its output terminal through transistors 531 and 533. The load at this input terminal is referred to as an "on load." An "on load" terminal can be modeled as a resistor/capacitor network 562 as shown in FIG. 5C. The resistors rstage1 and rstage2 represent the on resistance of transistors 531 and 533, respectively.

Capacitor $C_{OFF}$ represents the source capacitance of transistor 531. Capacitor $C_{PARA}$ represents the drain capacitance of transistor 531, the source capacitance of transistor 533, and the drain capacitance of transistor 537. Capacitance $C_{PAD}$ represents the drain capacitance of transistor 533, the drain capacitance of transistor 540, the drain capacitance of transistor 541, and the input capacitance to inverter 542.

Multiplexer 521 in FIG. 5B has an input terminal 535 that is decoupled from the multiplexer output. Because transistor 532 is on, a larger non-linear load is applied to the routing wire coupled to terminal 535. This non-linear load can be modeled as a linear RC network 561 shown in FIG. 5C. In RC network 561, $C_{OFF}$ represents the source capacitance of transistor 532. The resistor R1 represents the on resistance of transistor 532. $C_{PARA}$ represents the drain capacitance of transistor 532, the drain capacitance of transistor 536, and the source capacitance of transistor 540. The capacitances may also include any capacitive contribution due to the wires that are used to connect the transistors.

According to additional embodiments of the present invention, each non-linear load on a routing wire can be represented by a single capacitor in a simulation model. For example, each capacitor in the linear model can approximate the total capacitance that a routing multiplexer in a particular mode applies to a particular routing wire. Referring to FIG. 5C, RC network 561 is replaced with a single capacitor 563 equal to $C_{OFF}+C_{PARA}$ in this embodiment. RC network 562 is replaced with a single capacitor 564 equal to $C_{OFF}+C_{PARA}+C_{PAD}$. Capacitor 560 remains the same in this embodiment.

In the embodiments of FIG. 5C, capacitors and/or resistors approximate a non-linear load as an linear RC network. By modeling only the linear aspects of non-linear loads as shown in FIG. 5C, the speed of a circuit simulator of the present invention is greatly increased, and the output signals and timing delays are substantially accurate.

In further embodiments of the present invention, the non-linear aspects of non-linear loads can be modeled using linear circuit elements (e.g., resistors and capacitors). Thus, in this embodiment, linear circuit elements approximate the behavior of the linear and the non-linear aspects of non-linear loads. This embodiment increases the accuracy of the simulated output signals, while maintaining a relatively high speed simulation.

In each of these embodiments, the capacitances used to represent the RC networks are optimized to minimize the simulation error caused by this approximation. Further, in these embodiments, two distinct values of each of the resistor and capacitor components may be used to improve the accuracy of the simulation. One value can be used for a rising transition on a wire, and another value can be used for a falling transition on the wire. The capacitances used when simulating a multiplexer as a driving circuit may be distinct from the capacitances used when simulating a multiplexer as a load. (e.g., in one of the modes shown in FIG. 5B)

According to another embodiment of the present invention, a driving circuit (e.g., a transistor) is modeled in detail as a non-linear electrical circuit. When simulating a driving circuit, only one signal path is considered. All other inputs to the driving circuit are at constant voltages. This assumption can lead to simplifications in the electrical circuit models.

Other circuit topology considerations may lead to similar simplifications. For example, a detailed electrical model of a metal-oxide-silicon field-effect transistor (MOSFET) may include four terminals. In general, a MOSFET model has 3 inter-terminal voltages ($V_{GS}$, $V_{BS}$, and $V_{DS}$). The terminal currents in a MOSFET model are functions of these three voltage variables.

When a routing multiplexer in a PLD is simulated, usually at least one terminal of each transistor in the multiplexer is held constant. For example, in the case of a pass transistor in a routing multiplexer, $V_G$ and $V_B$ are held constant, so that the current through the pass transistor can be defined as a function of $V_S$ and $V_D$.

Alternatively, the current through the pass transistor can be determined if either $V_{BS}$ and $V_{DS}$, or $V_{GS}$ and $V_{DS}$ are known. In either case, the electrical properties of the device are completely defined as a function of two variables. Similarly, for a transistor in an inverter $V_{BS}=0$, so the electrical properties of the transistor are completely defined by $V_G$ and $V_D$, or equivalently by $V_{GS}$ and $V_{DS}$.

An aspect of the present invention is that all non-linear devices such as MOSFET transistors are modeled taking into consideration the fixed voltages on the some of the device terminals to reduce the number of variables relevant to the electrical model of the device.

Another aspect of the present invention is that a database can be used to store the electrical characteristics of a non-linear device such as a transistor, a non-linear capacitor, or a non-linear inductor. For example, a table can be constructed for a MOSFET transistor that includes example values of the drain-source current $I_{DS}$ through the transistor as a function of the drain and source voltages $V_D$ and $V_S$. The data in the table is stored in a database. An interpolation method is used to determine the value of the drain-source current for any values that are not stored in the database.

Tables for non-linear circuits are typically constructed by using a detailed and accurate electrical model. For example, software code containing an algorithmic model of the transistor characteristics, such as an analytical device model, can create the table directly. Alternatively, a predefined program that contains an appropriately detailed model of the non-linear circuit can be used (e.g., HSPICE).

The non-linear circuit is first simulated using the simulator program (or other code) to obtain electrical properties (e.g., $I_{DS}$) for given terminal voltages (e.g., $V_D$ and $V_S$). The electrical properties are then stored in a database. According to the present invention, the electrical properties in the database are read during a simulation procedure to determine the circuit delay. An interpolation method is used to determine values for electrical properties that are not stored in the database.

By reading and interpolating data stored in the database, a non-linear circuit can be simulated in substantially less time than by using analytical models to solve complex equations representing the non-linear circuit. Solving these complex equations to determine voltages and currents at many nodes during a simulation process can be very time consuming.

Another embodiment of the present invention involves models that are specific to transistors in a programmable circuit such as a PLD, a field programmable gate array (FPGA), or a programmable logic array. Each common transistor topology is characterized as a non-linear building block model.

FIG. 6 illustrates five non-linear building block models for transistors. All of the transistors in a routing multiplexer can be classified as generalized two-port element 602, buffer 605, or pass element 604. Each model in FIG. 6 can be used as a building block for simulating larger circuits such as driving elements.

Each building block in FIG. 6 has two controlling voltages $V_1$ and $V_2$, and one or more current output signals $I_1$ and/or $I_2$. The output current signals are determined as a function of the input voltages. For pass transistor block 604, the current into one terminal is the current coming out of the other terminal. For block 602, output currents $I_1$ and $I_2$ have no predefined relationship.

A fourth block called a generalized current source 601 can also be defined. Current source 601 has two controlling voltage input signals $V_1$ and $V_2$, and two separate current output signals $I_1$ and $I_2$.

Output current values for $I_1$ and $I_2$ that correspond to a range of input voltages $V_1$ and $V_2$ for the models shown in FIG. 6 are stored in a database, as discussed above. During simulation, the current values are accessed from the database. Current values that are not in the database can be determined using interpolation based on values stored in the database.

If it is desirable to model the non-linear capacitances of each transistor, corresponding building blocks with non-linear charge $Q(V_1,V_2)$ may also be defined. Generalized IQ 2-port block 603 is an example of such a building block. The charge for each non-linear capacitance is determined by accessing pre-calculated data from a database and using this data to compute approximate values for the charge using an interpolation method (as described above for $I_{DS}$). In further embodiments, other circuit designs for drivers have building blocks with more than two controlling voltages.

Each driving element can be represented as an electrical circuit using building blocks such as the ones shown in FIG. 6, together with other passive RC elements. For example, a multiplexer 700 may be represented in one implementation using the circuit of FIG. 7. As shown in FIG. 7, circuits 701, 702, 703, and 704 of multiplexer 700 can be characterized using appropriate building blocks from FIG. 6.

According to simulation techniques of the present invention, each type of driving element can be represented by a model that simulates its linear and non-linear aspects. The electrical parameters of each distinct type of driving element (e.g., a transistor) are reduced to the numerical parameters that define the linear electrical elements of the model.

Non-linear aspects of buildings blocks that correspond to distinct types of driving element can be calculated in advance and stored in a database (e.g., in table formats). According to the present invention, electrical table data for driving elements such as MOSFETs is automatically extracted. During simulation, a simulator of the present invention accesses data from the database and interpolates values from this data, rather than calculating exact values. This technique saves time and is substantially accurate.

For example, a simulator such as HSPICE can be used to calculate electrical data for a pass transistors. A model of a pass transistor in HSPICE is used to determine electrical properties for various selected terminal values. These electrical properties are then stored in a database as a table.

When a simulator of the present invention simulates pass transistors 701 and 702, the simulator accesses the electrical properties from the database to perform the simulation. The simulation requires the electrical properties to determine controlling voltage values that are not stored in the database. The simulator can access the electrical properties from the database and interpolate reasonably accurate controlling voltage values based on the stored electrical properties. Other interpolation techniques may also be used. For example, a quadratic interpolation may be performed.

The electrical data for the database can be obtained using any well-known circuit simulator such as HSPICE. For example, HSPICE contains a library of circuit models that represent the individual building blocks that represent non-linear circuits in a circuit design.

The HSPICE circuit models are instantiated with the specific parameters corresponding to a given routing switch. A program generates the appropriate HSPICE netlist and control statements to run analyses to compute the electrical properties associated with each non-linear building block. A predefined library of common structures used to extract electrical properties of the driving elements and loads may also be included as input to HSPICE. The program extracts the electrical properties into a form that can be used by the simulation techniques of the present invention.

There are two parts to this extraction. One part is the extraction of the non-linear characteristics of each device. The non-linear characteristics are determined using a DC analysis. FIG. 8 illustrates an example circuit 812 for measuring the input currents to a 2-port block representing buffer 703 shown in FIG. 7. Circuit 812 can be modeled in HSPICE and simulated to obtain values that are stored in a database as discussed above.

The second part is the extraction of linear components. Linear components are used to approximate the non-linear components (such as a linear approximation of diffusion capacitance). For example, transient analysis can be performed to determine characteristics of linear components that are used to approximate non-linear components. Transient analysis is used to drive the linear circuit with an appropriate stimulus.

Transient analysis can be performed, for example, by applying a voltage transition from zero volts to the supply voltage Vdd to an input terminal of a transistor to determine a capacitance associated with that input terminal. The input current $I_{IN}$ to the capacitance under test $C_{TEST}$ is measured in response to the stimulus using a current controlled current source. The measured input current $I_{IN}$ is then applied to a reference capacitor $C_{REF}$ that has an arbitrarily-chosen, known capacitance value. The total voltage change (delta V) on reference capacitor $C_{REF}$ in response to the input current $I_{IN}$ is then measured. An average value for the capacitance under test $C_{TEST}$ equals (delta V)×$C_{REF}$/Vdd.

Some example measurement circuits are shown in FIG. 8. Transient analysis can be used to calculate a gate-drain capacitance for transistor 830, a gate capacitance for transistor 831, and a source capacitance for transistor 832. The simulation systems of the present invention can use these linear transistor capacitances to approximate non-linear capacitances at the transistor terminals.

As an example, a voltage transition from zero volts to supply voltage Vdd is applied to the gate of transistor 831 to measure its gate capacitance $C_{GATE}$. The source, the bulk, and the drain of transistor 831 are all coupled to ground. The input current $I(V_{IN})$ to the gate of transistor 831 is measured using a current controlled current source. The input current $I(V_{IN})$ is then integrated into a known reference capacitor $C_{REF}$ using current source 833 as shown in FIG. 8. The total voltage change (delta V) on capacitor $C_{REF}$ is measured in response to the input current $I(V_{IN})$. The gate capacitance $C_{GATE}$ of transistor 831 can then be calculated using the equation $C_{GATE}$=(delta V)×$C_{REF}$/Vdd.

Using these two techniques, each driving element can be characterized using a set of tables for the non-linear currents or charges, and a set of linear components.

By using the aspects of the present invention, the simulation of a single simulation path includes the simulation of an electrical circuit containing non-linear building blocks and linear components that represent the driving elements. The simulation also includes linear electrical components that represent the wires and the loads (although additional non-linear representations are also possible).

Typically, there are many more linear components than non-linear components. In an embodiment of the present invention, a simulation algorithm performs time domain simulation of circuits with linear and non-linear components.

Prior art techniques perform time advancement integration to solve equations that model the behavior of the non-linear components. This requires several iterative solution attempts to determine voltages and currents at each point in time. Thus, prior art techniques are typically slow and time consuming.

According to an aspect of the present invention, the voltages for the non-linear components are determined separately from the voltages for the linear components. Therefore, multiple iterations only need to be performed to determine the output signals for the non-linear nodes in the circuit, thus saving time. The linear components only require a single iteration to determine the nodal voltages. Non-linear nodes are nodes that are connected to non-linear circuit elements.

A mathematical technique for performing simulations of the present invention is now discussed. In the example below, the non-linear components are voltage controlled current sources. However, it should be understood that the present invention also includes non-linear capacitances and other non-linear elements.

The basic formulation of the nodal equations describing a simulation path of a circuit according to the present invention is:

$$G \times v + C \times \frac{dv}{dt} + J \times f(v) = 0 \qquad (1)$$

G is a matrix of conductances with g[i][j] giving the conductance between node i and node j, and g[i][i] is the sum of all conductances connected to node i. A conductance is the inverse of a resistance value. The matrix C gives the capacitances between node i and node j, and c[i][i] is the sum of all capacitances connected to node i. The matrix J describes the connections between a set of non-linear current sources given by f(v). The entry j[i][j] is 1 if the jth current source is connected to node i.

Trapezoidal integration is then applied to equation (1) to discretize it in time. This relates the voltages $v_k$ at time point $t_k$ and $v_{k+1}$ at time point $t_{k+1}$ with $h=t_{k+1}-t_k$.

$$G \times \frac{h}{2} \times (v_{k+1} + v_k) + C \times (v_{k+1} - v_k) + J \times \frac{h}{2} \times (f(v_{k+1}) + f(v_k)) = 0 \qquad (2)$$

Multiply by $$\frac{2}{h}$$

to simplify:

$$G \times (v_{k+1} + v_k) + C \times \frac{2}{h} \times (v_{k+1} - v_k) + J \times (f(v_{k+1}) + f(v_k)) = 0 \qquad (3)$$

At any simulation step, $v_k$ is known and the problem is to compute $v_{k+1}$. Therefore factor around these two terms.

$$\left[G + C \times \frac{2}{h}\right] \times v_{k+1} + \left[G - C \times \frac{2}{h}\right] \times v_k + J \times f(v_k) + J \times f(v_{k+1}) = 0 \qquad (4)$$

Since $v_k$ is known we can evaluate $f(v_k)$ and rewrite this as $$A \times v_{k+1} + b + J \times f(v_{k+1}) = 0 \qquad (5)$$

where $$A = G + C \times \frac{2}{h} \qquad (6)$$

$$b = \left[G - C \times \frac{2}{h}\right] \times v_k + J \times f(v_k) \qquad (7)$$

The core of the simulation algorithm is to solve equation (5) efficiently. For simplicity, assume that the nodes are ordered such that all of the nodes with a connection to a non-linear device are ordered first, and the nodes that have connections only to linear devices are ordered after these. Note that there is a subtle point to this. A node with a connection to a non-linear device may either effect one of the f functions, or cause a 1 in one of the rows of J. For example, node 1 might have a current flowing into it that is a function f(v2, v3). This would be due to a device connected to nodes 1, 2, and 3.

To solve equation (5) efficiently, we need to break out the non-linear components so they can be solved separately. This involves finding the smallest set of equations that have any effect on the non-linear part of the system, and eliminating any dependencies on the remaining linear components. To do this, find some matrix P and multiply equation (5) by P.

$$P \times A \times v_{k+1} + P \times b + P \times J \times f(v_{k+1}) = 0 \qquad (8)$$

The essential requirement of P is that the matrix P×A have all 0s in the entries ij for all 0<=i<n, and n<j<m, where n is the number of non-linear nodes and m is the total number of nodes. This means that the values in the top right rectangle of the matrix P×A is all 0. This is illustrated in FIG. 9.

Simplifying the matrix P×A in this way results in a non-linear set of equations that contains only n independent variables. A non-linear solver such as Newton-Raphson iteration or a non-linear relaxation can be used to solve for this set of equations. Once the n independent variables are known, a forward solution can be performed on the remaining linear equations to determine the complete solution.

For simplicity, the matrix P is the inverse of A, so $P=A^{-1}$ and the reduced system is $$v_{k+1} + P \times b + P \times J \times f(v_{k+1}) = 0 \qquad (9)$$

This has the virtue of simplicity, but adds the requirement that the inverse of A must exist. In circuit terms, this means that there must be a path with conductance from every node to ground. For a transient simulation, the conductance can be a capacitor, so this is typically not a problem. However, it is also typically useful to do DC analyses to automatically get the initial state of the network, which can easily be done by setting h to infinity. This requires that a resistive path to ground exist for every node. This can be ensured by adding large resistors to every node that has no resistive path, such that the resistors do not interfere with the dynamic operation of the circuit, but ensure DC convergence. It is possible to change the generation of the P matrix to eliminate this requirement, however, it complicates the solution of the reduced equations.

In the general case, assume that P is computed according to the rule above, such that (P×A) has all 0s in the entries ij for all 0<=i<n, and n<j<m, where n is the number of non-linear nodes, and m is the total number of nodes in the circuit. In this case, by the definition of the non-linear nodes, the first non-linear node equations are functions only of the first non-linear node variables n. Thus, these equations can be solved independently from the rest of the system. This can be seen from the structure of the equations shown in FIG. 9.

FIG. 9 illustrates a form of equation (5), in which matrix A has been altered to simplify the process of solving the nodal equations. The non-linear functions $f(v_{k+1})$ are only dependent on the n non-linear nodes. The presence of the 0 in the top right corner of matrix A, means that a first group of non-linear node equations can be expressed as $(A_u \times v_u) + b_u + (J_u \times f(v_u)) = 0$. The subscript u refers to the portions of the matrices Au, Vu, bu, and Ju shown in FIG. 9. These portions of the matrices are only dependent on the first non-linear nodes. The function f only depends on the first number n of non-linear node entries in the v matrix.

Once equation (5) is reduced to the form shown in FIG. 9, it can be solved using an iterative solver such as Newton-Raphson iteration, linear relaxation, or non-linear relaxation.

To solve the equation using Newton-Raphson, denote the equation (5) as g(v)=A×v+b+J×f(v)=0 where the u subscript is dropped for brevity, and v refers to the first n non-linear node entries in the original $v_{k+1}$. Using Newton-Raphson iteration, equation (5) can be solved iteratively using to equation (10):

$$g(v^k) + \frac{\partial g(v^k)}{\partial v^k} \times (v^{k+1} - v^k) = 0 \tag{10}$$

In equation (10), $v^k$ denotes the kth iteration of the solution of v. Equation (10) can be rewritten as equation (11):

$$\frac{\partial g(v^k)}{\partial v^k} \times v^{k+1} = \frac{\partial g(v^k)}{\partial v^k} \times v^k - g(v^k) \tag{11}$$

Equation (11) is expressed as a linear set of equations in $v^{k+1}$. The first term in equation (11) is shown by equation (12).

$$\frac{\partial g(v^k)}{\partial v^k} = A + J \times \left[\frac{\partial f_i}{\partial v_j}\right] \tag{12}$$

To solve equations (10)-(12), the following steps are performed:
1. Evaluate all of the non-linear functions and their partial derivatives to compute $f(v^k)$ and $$\left[\frac{\partial f_i}{\partial v_j^k}\right].$$

2. Compute the matrix $$\frac{\partial g(v^k)}{\partial v^k}$$

according to the equation (12) and compute the right hand side of equation (11):

$$\frac{\partial g(v^k)}{\partial v^k} \times v^k - g(v^k).$$

3. Solve the equations (10)-(12) using a linear equation solver producing $v^{k+1}$.
4. If the change in voltage $|v^{k+1}-v^k|$ is smaller than some specified tolerance, stop. Otherwise, perform another iteration of steps 1 through 4.

Following this iteration, the values of f are known and the remainder of the voltages denoted by Vh in the diagram may be solved for. This produces the complete solution of the voltages for this time point.

The time step is adjusted according to standard techniques for local truncation error control, by forward extrapolating each nodal voltage to predict $v^o$ for the time step and monitoring the largest cumulative change on any node due to the time step.

It is not essential to the algorithm that the non-linear nodes are ordered first in the matrix, but this step simplifies the algorithm. The subset of voltages that are solved using the non-linear equations in the u portions of the matrices shown in FIG. 9 should include all of the voltages that effect any of the non-linear function f values. This subset of voltages should also include all of the voltages that are present in the original nodal equations that include a non-linear function f.

An example of how voltages at non-linear nodes in a circuit can be determined using the simulation techniques of the present invention is now discussed. An example circuit is shown in FIG. 10. This example circuit corresponds to equation (5): $(A \times v_{k+1}) + b + (J \times f(v_{k+1})) = 0$. In the circuit of FIG. 10, the voltage at node 1 is v1, the voltage at node 2 is v2, and the voltage at node 3 is v3. Using Kirckhoff's current law at nodes 1, 2, and 3, the following three equations can be derived:

(−g1−g2)×v1+g2×v2+b1=0        Node 1 g2×v1+(−g2−g3)×v2=0        Node 2

−g4×v3+f(v1)=0        Node 3

These three equations can be represented as the following matrix equation:

$$\begin{vmatrix} -g1-g2 & g2 & 0 \\ g2 & -g2-g3 & 0 \\ 0 & 0 & -g4 \end{vmatrix} \times \begin{vmatrix} v1 \\ v2 \\ v3 \end{vmatrix} + \begin{vmatrix} b1 \\ 0 \\ 0 \end{vmatrix} + \begin{vmatrix} 0 \\ 0 \\ 1 \end{vmatrix} \times [f(v1)] = 0 \tag{13}$$

Because f(v1) is non-linear, it is necessary to solve for the appropriate voltage for v1. Because v3 occurs in the equation for node 3, it is also necessary to solve for the value of v3. In general, it is necessary to solve for any of the voltages v[i] that occur in one of the non-linear functions f( ) (e.g., voltage v1), and any of the voltages v[i] that occur in equations in which one of the non-linear functions f( ) is used (e.g., voltage v3). In some circuits, it is possible to solve for fewer equations.

Voltages v1 and v3 can be determined using a non-linear solution. The two variables (v1 and v3) can be solved for, if two equations in equation (5) can be reduced to two variables (v1 and v3).

It is somewhat easier in a computer solution to reorganize the equations such that the matrix is split into two parts. Equation (5) can be broken into two parts, and the first part can be solved using a non-linear solution. In the example of FIG. 10, equation (5) can be rewritten so that v1 and v3 are placed in the top part of matrix v, with a corresponding change in matrix A:

$$\begin{vmatrix} -g1-g2 & 0 & g2 \\ 0 & -g4 & 0 \\ g2 & 0 & -g2-g3 \end{vmatrix} \times \begin{vmatrix} v1 \\ v3 \\ v2 \end{vmatrix} + \begin{vmatrix} b1 \\ 0 \\ 0 \end{vmatrix} + \begin{vmatrix} 0 \\ 0 \\ 1 \end{vmatrix} \times [f(v1)] = 0 \tag{14}$$

The top two equations corresponding to v1 and v3 in equation (14) can now be solved using a non-linear solution. The equation that correspond to v1 includes a contribution from g2×v2. It is easier to solve for v1 and v3 if g2×v2 can be eliminated from this equation. The term g2 can be eliminated by adding the multiple $$\frac{g2}{g2+g3}$$

times the third row of matrix A to the first row. As above, the third row (previously the second row) is g2×v1+(−g2−g3)× v2=0. Multiplying the third row by $$\frac{g2}{g2+g3}$$

gives:

$$\frac{g2^2}{g2+g3} \times v1 - g2 \times v2 = 0 \qquad (15)$$

Adding equation (15) to the first row of matrix A cancels out the v2 term in the first row. The result is equation (16).

$$\begin{vmatrix} -g1-g2+\frac{g2^2}{g2+g3} & 0 & 0 \\ 0 & -g4 & 0 \\ g2 & 0 & -g2-g3 \end{vmatrix} \times \begin{vmatrix} v1 \\ v3 \\ v2 \end{vmatrix} + \qquad (16)$$

$$\begin{vmatrix} b1 \\ 0 \\ 0 \end{vmatrix} + \begin{vmatrix} 0 \\ 1 \\ 0 \end{vmatrix} \times [f(v1)] = 0$$

This is equivalent to choosing the matrix P as:

$$\begin{vmatrix} 1 & 0 & \frac{g2}{g2+g3} \\ 0 & 1 & 0 \\ 0 & 0 & 1 \end{vmatrix}$$

The matrix A now has the desired form, such that the top two rows of matrix A only depend on v1 and v3. Matrix P is also multiplied to the other two terms in equation (16) as shown in equation (8) above. The non-linear solution of the equations represented by the top two rows of matrix A can be performed without considering v2. After these two equations are solved using the non-linear solver, the values of v1 and v3 are known and the value of v2 can be solved for.

FIG. 11 is a flow chart that illustrates process steps according to an embodiment of the present invention. The process illustrated in FIG. 11 can be used to create a simulation model of a circuit according to an embodiment of the present invention. At step 1101, the circuit to be simulated is divided into sets of simulation paths as discussed above. At step 1102, linear models are created for each of the loads in the simulation paths. The linear models may, for example, comprise resistor/capacitor networks, as discussed above.

At step 1103, non-linear models are created for each of the drivers in the simulation paths. The driver models are constructed using both linear components to represent the capacitances and resistances of the driver, together with an appropriate set of non-linear components as illustrated in FIG. 7.

FIG. 12 is a flow chart that illustrates process steps according to another embodiment of the present invention. The process illustrated in FIG. 12 can be used to simulate a model of a circuit according to an embodiment of the present invention. At step 1201, a first simulation path is simulated only during times that a signal propagates through the first simulation path. At step 1202, a second simulation path is simulated only during times that a signal propagates through the second simulation path.

Similar process steps can be performed for any additional number of simulation paths. By only simulating the simulating paths during time period when the simulation paths are active, the circuit can be simulated in substantially less time, using less resources.

The simulation techniques of the present invention are thousands of times faster than comparable methods such as HSPICE, while having accuracy that can be within 1%. Thus, the accuracy of the delay model of the present invention is greatly increased compared to previous methods, while being fast enough to use in a delay extraction for programmable circuits such as PLDs as well as other circuits. Furthermore, the simulation techniques of the present invention extract the electrical parameters directly from example circuits, eliminating the need for developing ad-hoc curve fitted models.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for creating a simulation model of a circuit, the method comprising:
   dividing the circuit into sets of simulation paths, each simulation path comprising a single driving element and a load;
   creating a linear model for each of the loads in the simulation paths; and
   creating a second model for each of the single driving elements in the simulation paths by representing a first portion of each driving element as a linear circuit element and a second portion of each driving element as a non-linear circuit element,
   wherein the non-linear circuit elements are modeled using a table of values stored in a database.

2. The method of claim 1 wherein each linear model includes a capacitor.

3. The method of claim 2 wherein a subset of the linear models include resistors.

4. The method of claim 1 wherein the tables storing non-linear circuit element properties are determined using a computer program including an analytic or algorithmic model, and stored in the database.

5. The method of claim 1 wherein the second models comprise building blocks that represent non-linear voltage controlled current sources.

6. The method of claim 1 wherein voltages at linear and non-linear nodes in the circuit can be determined by solving equations that represent current flow into the non-linear nodes separately from equations that represent the current flow into the linear nodes.

7. The method of claim 1 wherein the second models comprise building blocks that represent pass transistors, buffers, or a voltage controlled current source.

8. A method for simulating a circuit, wherein the circuit comprises delay paths, the method comprising:
  dividing one of the delay paths in the circuit into simulation paths, each simulation path comprising a single driving element and a load;
  simulating a first one of the simulation paths only during times that a signal propagates through the first simulation path; and
  simulating a second one of the simulation paths only during times that a signal propagates through the second simulation path,
  wherein a linear model is used to represent aspects of each of the loads in the simulation paths, and a non-linear model is used to represent aspects of each of the driving elements in the simulation paths.

9. The method of claim 8 wherein each of the non-linear models includes a linear representation and a non-linear representation of aspects of the corresponding driving element.

10. The method of claim 9 wherein at least some of the linear representations comprise capacitors that approximate non-linear aspects of the driving elements.

11. The method of claim 8 wherein simulating the first and the second simulation paths further comprising:
  accessing data from memory that represents the non-linear models; and
  interpolating table values of the non-linear models using the data.

12. The method of claim 11 wherein the data is derived using a computer program including analytical or algorithmic models of the driving elements.

13. The method of claim 8 further comprising:
  simulating a third one of the simulation paths only during times that a signal propagates through the third simulation path.

14. The method of claim 8 wherein the non-linear models comprise building blocks that represent a pass transistor, a buffer, and a generalized two-port circuit.

15. The method of claim 14 wherein the non-linear models further comprise a building block that models non-linear capacitances of a transistor.

16. A computer system for simulating a circuit that comprises simulation paths, the computer system comprising:
  code for dividing the circuit into simulation paths, each simulation path comprising a single driving element and a load;
  code for simulating a first driver circuit in a first simulation path during a first time period when a signal propagates through the first simulation path using a first non-linear circuit element model, wherein the first non-linear circuit element model comprises tabular representations of electrical properties of the first driver circuit stored in a database; and
  code for simulating a second circuit in the first simulation path during the first time period using a first linear circuit element model, wherein the second circuit is a load on the first driver circuit,
  wherein code for simulating the circuit uses a linear model to represent aspects of each of the loads in the simulation paths, and a non-linear model to represent aspects of each of the driving elements in the simulation paths.

17. The computer system of claim 16 further comprising:
  code for simulating a third driver circuit in a second simulation path during a second time period when a signal propagates through the second simulation path using a second non-linear circuit element model, wherein the second non-linear circuit model includes tabular representations of electrical properties of the third driver circuit stored in the database; and
  code for simulating a fourth circuit in the second simulation path during the second time period using a second linear circuit element model, wherein the fourth circuit is a load on the third driver circuit.

18. The computer system of claim 17 wherein the first simulation path is only simulated when a signal propagates through the first simulation path; and the second simulation path is only simulated when a signal propagates through the second simulation path.

19. The computer system of claim 16 wherein the code for simulating the first driver circuit further comprises:
  code for determining voltages at linear and non-linear nodes in the circuit by solving equations that represent current flow into non-linear nodes separately from equations that represent the current flow into the linear nodes.

20. The computer system of claim 16 wherein the first non-linear circuit element model further comprises a linear approximation of non-linear aspects of the first driver circuit, the linear approximation including a resistor and a capacitor.

21. The computer system of claim 16 wherein the first non-linear circuit element model comprises a building block that models non-linear capacitances of a transistor.

22. The computer system of claim 16 wherein the first non-linear circuit element model comprises a building block that represents a pass transistor.

23. The computer system of claim 16 wherein the first non-linear circuit element model comprises a building block that represents a buffer.

24. The computer system of claim 16 wherein the code for simulating the first driver circuit further comprises:
  code for interpolating tabular representations of the electrical properties of the first driver circuit to obtain the first non-linear circuit element model.

* * * * *